US00RE40105E

(19) United States
(12) Reissued Patent
Momohara

(10) Patent Number: US RE40,105 E
(45) Date of Reissued Patent: Feb. 26, 2008

(54) PROBE CARD HAVING GROUPS OF PROBE NEEDLES IN A PROBING TEST APPARATUS FOR TESTING SEMICONDUCTOR INTEGRATED CIRCUITS

(75) Inventor: Tomomi Momohara, Yokohama (JP)

(73) Assignee: Kabushiki Kaisha Toshiba, Kawasaki-Shi (JP)

(21) Appl. No.: 09/686,200

(22) Filed: Oct. 5, 2000

Related U.S. Patent Documents

Reissue of:
(64) Patent No.: 5,818,249
Issued: Oct. 6, 1998
Appl. No.: 08/718,660
Filed: Sep. 23, 1996

(30) Foreign Application Priority Data

Sep. 27, 1995 (JP) ..... 7-249531

(51) Int. Cl.
*G01R 31/02* (2006.01)

(52) U.S. Cl. ..... 324/762; 324/765
(58) Field of Classification Search ..... 324/754–765, 324/72.5, 158.1; 439/482, 824; 438/14–18
See application file for complete search history.

(56) References Cited

U.S. PATENT DOCUMENTS 4,523,144 A * 6/1985 Okubo et al. ..... 324/762
4,799,009 A * 1/1989 Tada et al. ..... 324/756
4,994,735 A * 2/1991 Leedy ..... 324/754
5,012,187 A * 4/1991 Littlebury ..... 324/754
5,070,297 A * 12/1991 Kwon et al. ..... 324/754
5,148,103 A * 9/1992 Pasiecznik, Jr. ..... 324/758
5,525,912 A * 6/1996 Momohara ..... 324/754
5,623,214 A * 4/1997 Pasiecznik, Jr. ..... 324/754
5,642,054 A * 6/1997 Pasiecznik, Jr. ..... 324/754

FOREIGN PATENT DOCUMENTS

| | | |
|---|---|---|
| JP | 4-230045 | 8/1992 |
| JP | 5-113451 | 5/1993 |
| JP | 09-092694 | 4/1997 |

* cited by examiner

*Primary Examiner*—Vinh P. Nguyen
(74) *Attorney, Agent, or Firm*—Hogan & Hartson LLP

(57) ABSTRACT

A probe card which can help to enhance the productivity of semiconductor integrated circuits manufacturing and to reduce the manufacturing cost thereof, and a method of probe-testing semiconductor integrated circuits by using the probe card. The probe card is designed to test semiconductor integrated circuits formed on a semiconductor wafer and arranged in rows and columns. It has groups of probe needles provided to contact semiconductor integrated circuits arranged in two columns and at least two rows. The card receives a test signal from a test device and supplies the test signal simultaneously to these semiconductor integrated circuits arranged in two columns and at least two row, through the groups of probe needles. It receives response signals simultaneously from the semiconductor integrated circuits through the groups of probe needles and then supplies the response signals to the tester.

16 Claims, 11 Drawing Sheets

PROBE CARD HAVING GROUPS OF PROBE NEEDLES IN A PROBING TEST APPARATUS FOR TESTING SEMICONDUCTOR INTEGRATED CIRCUITS

Matter enclosed in heavy brackets [ ] appears in the original patent but forms no part of this reissue specification; matter printed in italics indicates the additions made by reissue.

*U.S. patent application Ser. No. 10/952,594 is a REISSUE OF U.S. patent application Ser. No. 08/718,660, filed Sep. 23, 1996 now U.S. Pat. No. 5,818,249, is a continuation of U.S. patent appliation Ser. No. 09/686,200 which is a REISSUE of U.S. patent application Ser. No. 08/718,660, now U.S. Pat. No. 5,818,249.*

BACKGROUND OF THE INVENTION

1. Field of the Invention

The present invention relates to a probe card for testing semiconductor integrated circuits and also to a method of probe-testing semiconductor integrated circuits by using the probe card.

2. Description of the Related Art

Probing test is performed on semiconductor integrated circuits for their electrical characteristics. The test is carried out after the wafer process and before the dicing process, namely after the integrated circuits have been formed in a semiconductor wafer, arranged in rows and columns. By this test it is determined whether the integrated circuits are defective or not. Any integrated circuit found defective is not subjected to an assembly step. This helps to prevent an unnecessary increase in the manufacturing cost of semiconductor devices.

The integration density of semiconductor integrated circuits (ICs) has much increased in recent years. Because of the increased integration density, the time of testing each integrated circuit, or each IC chip (hereinafter called "chip"), has increased. Until recently the probing test has been performed, chip by chip. At present a plurality of chips are tested simultaneously, in order to shorten the time of testing one chip.

FIG. 1 is a perspective view, illustrating a conventional probe card 5 and a semiconductor wafer 1. As FIG. 1 shows, 84 chips 3 are arranged in rows and columns on the semiconductor wafer 1. The probe card 5 has one probe-needle hole 7. Protruding through the hole 7 are four groups 9a, 9b, 9c an 9d of needles to test four chips 3a, 3b, 3c and 3d. Thus, the probe card 5 is used to test four chips at the same time, for determining the electrical characteristics of the chips.

The integration density of semiconductor integrated circuits, particularly semiconductor memories, is still increasing. The time for testing one chip inevitably increases even if the probe card 5 (FIG. 1) is used. In order to shorten the time, it is necessary to provide more groups of [prove] *probe* needles for each column so that the card 5 may test more chips at the same time.

FIG. 2 is a perspective view, showing another type of a conventional probe card 5' and a semiconductor wafer 1. As seen from FIG. 2, the probe card 5' has eight groups 9a to 9h of needles, which protrude through a hole 7. The groups 9a to 9h of needles are provided to test eight chips 3a to 3h at the same time, whereas the four groups 9a to 9d of needles of the probe card 5 (FIG. 1) are used to test four chips 3a to 3d simultaneously. Hence, the probe card 5' helps to shorten the time required for testing one chip.

When the probe card 5' was used to accomplish a probing test, however, more chips were likely [found] to be *found* defective than in the case where the probe card 5 shown in FIG. 1 was used. To determine whether this tendency [is] *was* genuine or not, the chips tested by using the card 5' were tested, one by one. Of the chips which were found defective when tested [by means of the] *using* card 5', some proved flawless. This means that the probe card 5' can test chips but with an insufficient accuracy.

Some reasons for the insufficient test accuracy, that are conceivable at present, will be discussed below.

The response signals output from all chips simultaneously tested are supplied at the same time to the tester via the probe card 5'. The tester compares the levels, leading edge time and trailing edge time of the response signals with prescribed values or ranges, determining whether the chips are flawless or not.

The probe needles of the groups 9a to 9h are connected to probe contacts 11 provided on the circumferential edge of the probe card 5' by wires (not shown) which are provided within the card 5'. It is at the probe contacts 11 that the probe card 5' can contact a tester. The response signal from each chip tested has its level lowered before reaching the tester, because of the resistance of the wire provided in the card 5'. It is natural that the leading and trailing edge time of the response signal shift in accordance with the capacitance of the wire.

The more groups of probe needles provided to test more chips at a time, the greater the diameter D of the probe card 5'. As the the diameter D increases, so does the difference in length between a wire connecting a needle located at the center of the card 5' to the associated contact 11 and a wire connecting a needle at the edge of the card 5' to the associated contact 11. As this difference increases, the differences in resistance and capacitance among the wires increase in proportion. Further, the longer the wires, the higher the probability of crosstalk among the wires.

Moreover, the larger the diameter D, the more likely the probe card 5' will warp. If the card 5' warps, the contact resistances between the chip pads on the one hand and the probe needles on the other will become different, and so will become the contact resistances between the probe needles on the one hand and the tester on the other hand. As the probe card 5' warps, a stress is exerted on the wires provided in the card 5'. Each wire may have its electrical characteristics altered at that part on which an excessive stress is applied.

Any or some of the problems described above impair the accuracy of the probing test achieved by the probe card 5'. Due to theses problems, some of the chips simultaneously tested may be determined to be defective though they are actually flawless, particularly when the tester compares the levels, leading edges and trailing edges of the response signals from the chips with the prescribed values or ranges. In other words, the difference in resistance and capacitance among the wires provided in the card 5', the difference in pad-needle contact resistance, the difference in needle-tester contact resistance, the changes in the electrical characteristics of the wires, and the crosstalk among the wires prevent the tester from detecting the true characteristics of the chips tested at the same time.

This deterioration of probing-test accuracy is particularly prominent in the test of semiconductor memories having a large storage capacity. This is because these memories operate *at* so high a speed that only a little allowance is provided for the shifting of the leading and trailing edge time of each signal.

A semiconductor memory having a large storage capacity is one of the most delicate and sensitive devices. Its operation will be jeopardized if even a very small error is made. To see whether such a small error occurs or not, the memory is subjected to proving test which is performed by using a probe card under strict conditions. Therefore, a problem with the wires provided in the probe card lower the test accuracy, even if the problem is a very small one.

SUMMARY OF THE INVENTION

As indicated above, it is demanded that the time for performing probing test on semiconductor integrated circuits (ICs) be reduced as much as possible. To meet the demand it suffices to test as many IC chips as possible, at the same time. However, the more IC chips are tested simultaneously, the more chips will be determined to be defective though they are actually flawless. This would increase the manufacturing cost of the semiconductor integrated circuit.

Accordingly, the object of the present invention is to provide a probe card which can help to enhance the productivity of semiconductor integrated circuits and to reduce the manufacturing cost thereof, and also to provide a method of probe-testing semiconductor integrated circuits by using the probe card.

A probe card according to the invention is designed to test semiconductor integrated circuits formed on a semiconductor wafer and arranged in rows and columns. The probe card has groups of probe needles provided to contact semiconductor integrated circuits arranged in two columns and at least two rows. It receives a test signal from the tester and supplies the test signal simultaneously to these semiconductor integrated circuits through the groups of probe needles. It receives response signals simultaneously from the semiconductor integrated circuits through the groups of probe needles and then supplies the response signals to the tester.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 2:
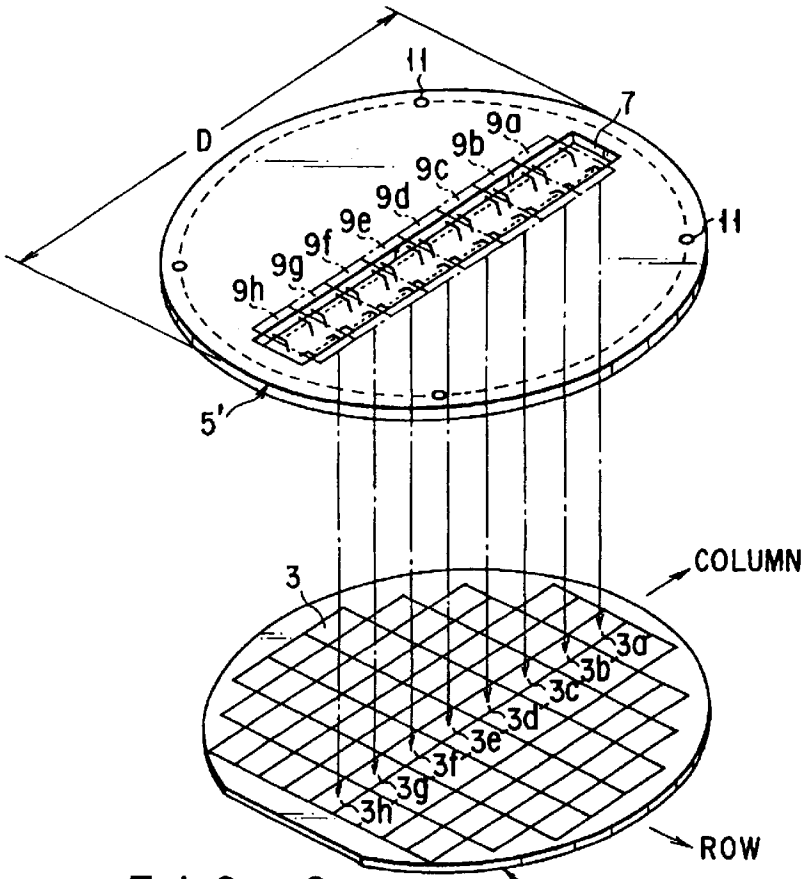
FIG. 2 PRIOR ART
FIG. 2 is a perspective view of a conventional probe card of another type.

Embodiments of the present invention will now be described, with reference to the accompanying drawings. The components shown in one drawing, which are similar or identical to those shown in any other drawing, are designated at the same reference numerals and will not be described in detail.

Figure 3:
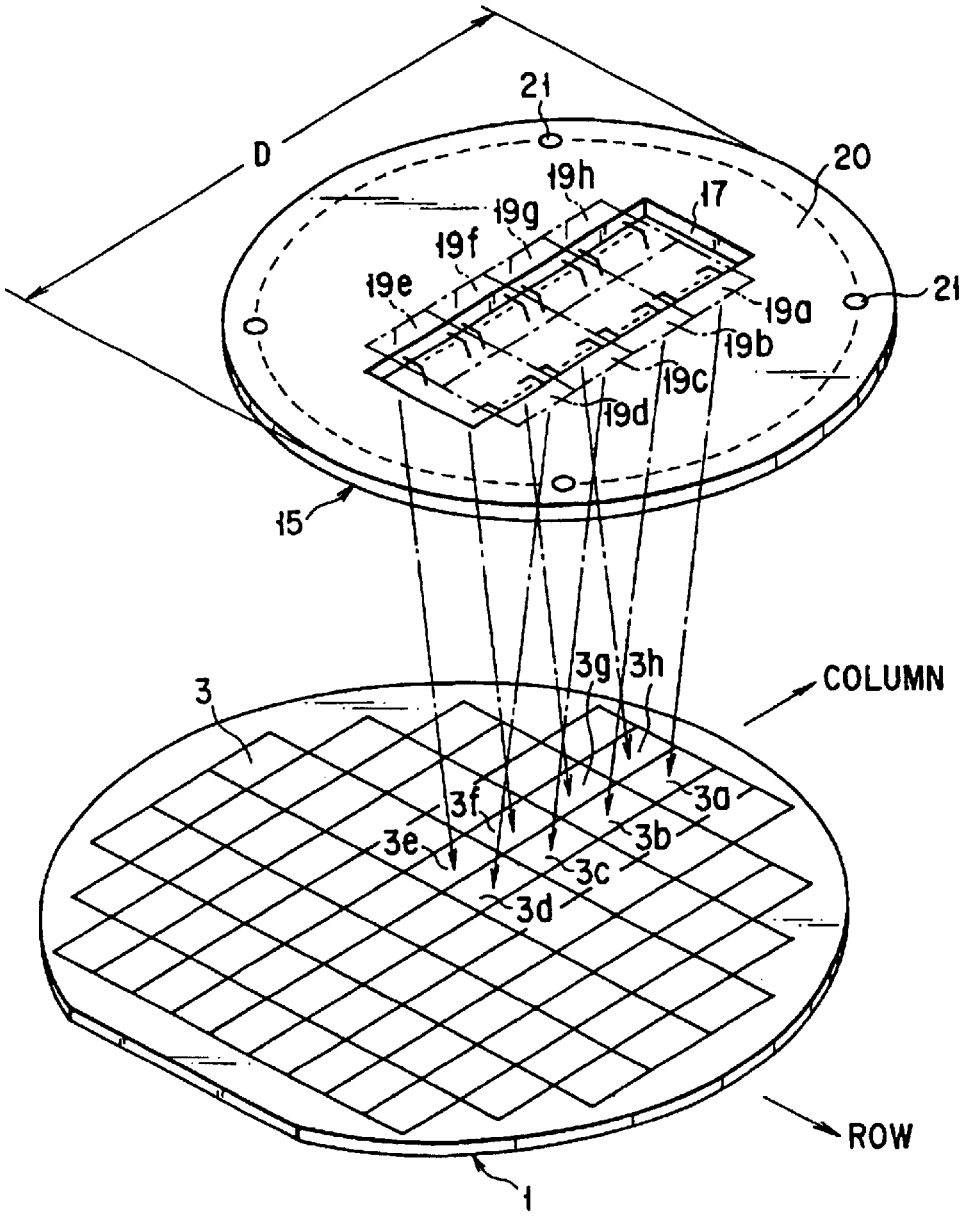
FIG. 3 is a perspective view of a probe card according to a first embodiment of the invention.
Figure 4:
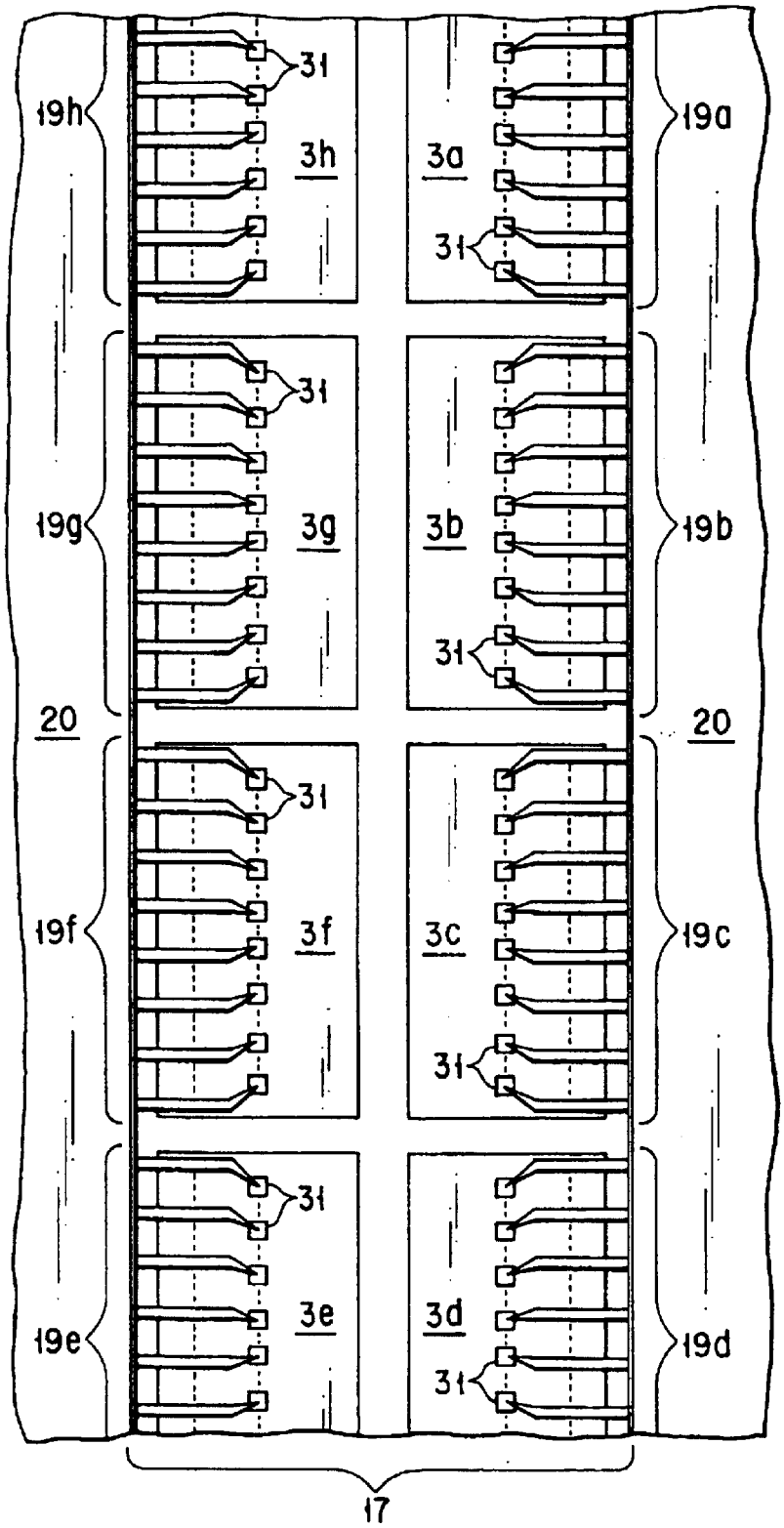
FIG. 4 is a magnified plan view of a part of the probe card, showing the probe needles.

FIG. 3 is a perspective view showing a probe card 15 according to the first embodiment of the invention, along with a semiconductor wafer 1. FIG. 4 is a magnified plan view of a part of the card 15. As FIG. 3 illustrates, 84 IC chips 3 are provided on the wafer 1, arranged in rows and columns.

The probe card 15 is designed to probe-test the chips 3. It comprises eight groups 19a to 19h of probe needles, a substrate 20 and probe contacts 21. The probe needles of the groups 19a to 19h can contact eight chips 3a to 3h arranged in four rows and two columns. The card substrate 20 has a rectangular through hole 17 having two short sides and two long sides. The first to fourth groups 19a to 19d of needles are provided on the card substrate 20 along one long side of the hole 17, and the fifth to eighth groups 19e to 19h of needles are provided on the card substrate 20 along the other long side of the hole 17. In other words, the groups 19a to 19h of needles are arranged in two rows, each row consisting of four groups. As shown in FIG. 4, the probe needles of the groups 19a to 19d extend downwards through the hole 17 to contact the external pads 31 of the IC chips 3a to 3d arranged in one column, and the probe needles of the groups 19e to 19h extend upwards through the hole 17 to contact the outer pads 31 of the IC chips 3e to 3h arranged in the next row. As shown in FIG. 3, the probe contacts 21 are provided on the substrate 20, arranged along the circumferential edge of the substrate 20. The contacts 21 are connected to the groups 19a to 19h of needles by wires (not shown) which are provided on or in the substrate 20.

In operation, the probe card 15 is positioned with respect to the semiconductor wafer 1, such that the probe needles of the groups 19a to 19h contact the outer pads 31 of the chips 3a to 3h, respectively, as is illustrated in FIG. 4. A test signal is supplied from a tester (not shown) to the probe contacts 21 and hence to the groups 19a to 19h of needles through the wires. The test signal is simultaneously supplied to the eight chips 3a to 3h through the groups 19a to 19h of needles. In response to the test signal, the chips 3a to 3h output response signals, which are supplied to the probe contacts 21 first through the groups 19a to 19h of needles and then through the wires. The response signals are ultimately supplied from the probe contacts 21 to the tester. The tester compares the levels, leading edge time and trailing edge time of the response signals with prescribed values or ranges. Thus, the tester determines, at a time, whether eight chips 3a to 3h arranged in four rows and two columns are flawless or not.

The probe card 15 shown in FIG. 3 serves to test eight chips 3a to 3h at a time, as does the conventional probe card 5' (FIG. 2) which has eight groups of probe needles arranged in one column. It helps to shorten the time required to test one chip, and ultimately the time required to test all chips on one semiconductor wafer.

Figure 1:
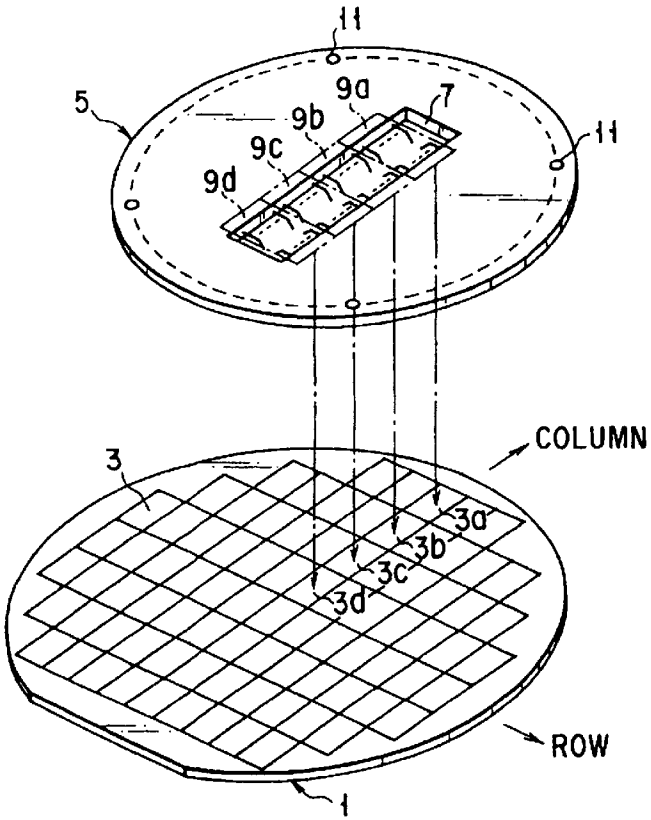
FIG. 1 PRIOR ART
FIG. 1 is a perspective view of a conventional probe card.

Furthermore, the probe card 15 has a diameter D as small as that of the conventional probe card 5 (FIG. 1) which has four groups of probe needles arranged in one column. As a result, the difference in length between the longest and shortest wires provided on or in the substrate 20 is similar to the conventional card 5. It fellows that the differences in resistance and capacitance among the wires is proportionally similar to the conventional card 5. Hence, the skew difference among the wires, which impairs the accuracy of probing test, disabling the tester to determine the true characteristic or ability of each chip tested *is similar to the conventional card 5*. Since the probe card 15 has a small diameter, it wraps but very little, exerting but a very little stress on the wires provided on or in the substrate 20 and scarcely altering the electrical characteristics of the wires. In addition, since the wires are short, the crosstalk among the wires is small.

In view of these advantages, the probe card 15 can serve to enhance the [productivity] *production* of semiconductor integrated circuits and also to reduce the manufacturing cost of semiconductor integrated circuits.

Figure 5A:
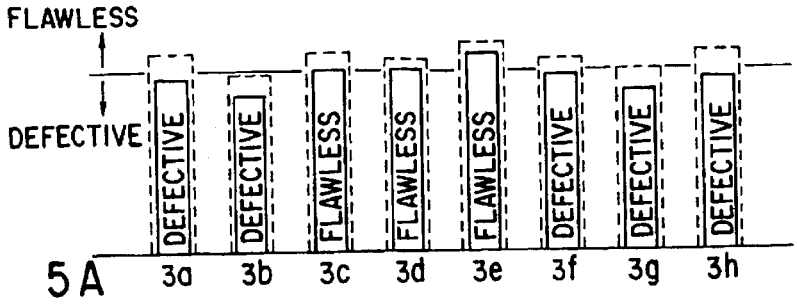
FIG. 5A is a graph representing the results of conventional probing test.
Figure 5B:
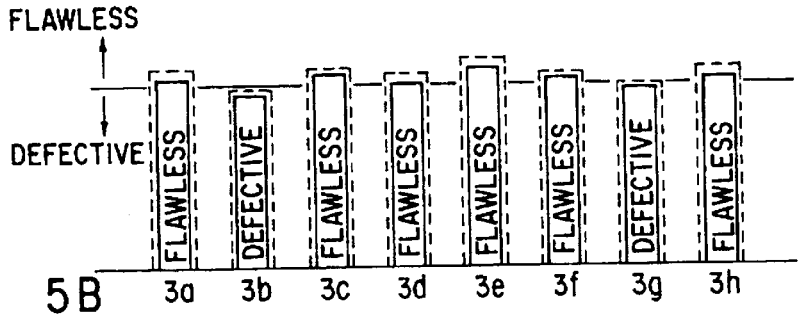
FIG. 5B is a graph representing the results of the probing test performed by using the probe card shown in FIG. 3.

FIG. 5A is a graph representing the results of conventional probing test, while FIG. 5B is a graph representing the results of the probing test performed by using the probe card 15. As seen from FIG. 5A, three out of eight chips 3a to 3h were found to be flawless when tested by using the probe card 5' shown in FIG. 2. In FIG. 5A, the true characteristics of the chips tested are indicated by broken lines. In view of the true characteristics of the chips, seven chips should have been found to be flawless. This means that four chips [were] 3a, 3f, 3g and 3h were regarded as defective, though they were flawless in fact.

When the probe card 15 was used, testing chips 3a to 3h arranged in four rows and two columns, six of the chips were found to be flawless, as can be seen from FIG. 5B. Only one of the chips was found to be defective, though it was actually flawless, as can be understood from FIG. 5B. It should be noted that the eight chips tested by using the probe card 15 were respectively identical in characteristics to those eight chips tested by using the conventional probe card 5'.

Namely, some of the flawless chips which were regarded as defective when tested by using the conventional probe card 5' were correctly found [to] flawless when tested by using the probe card 15 according to the invention. In other words, the probe card 15 serves to test chips with high accuracy, thus saving flawless chips which would have been discarded as defective if the conventional probe card 5' had been used. As a result, the probe card 15 serves to decrease the manufacturing cost of semiconductor integrated circuits.

A probe card 15 according to the second embodiment will be described, with reference to FIG. 6 which is a plan view. The second embodiment is characterized in that groups of wires are arranged on or in the substrate 20 such that all wires are as short as possible.

Figure 6:
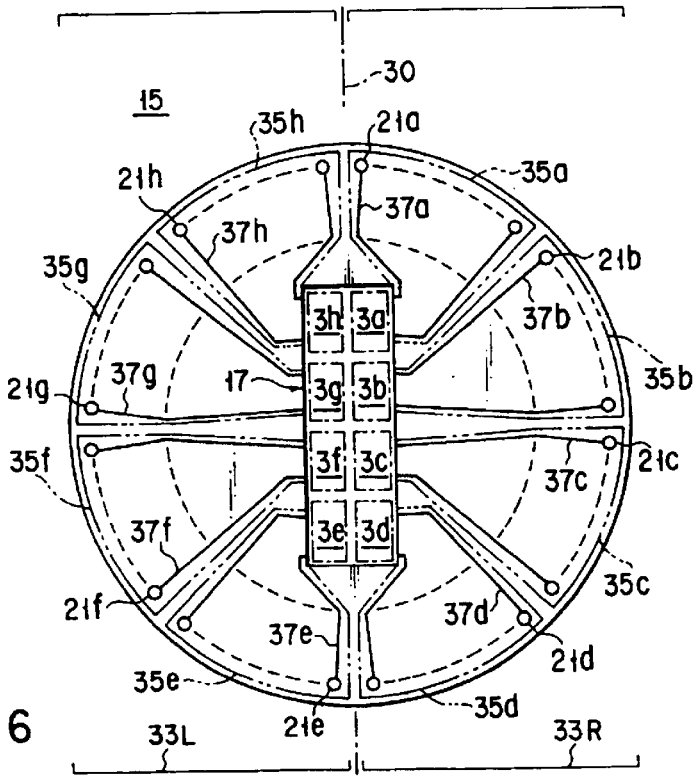
FIG. 6 is a plan view of a probe card according to a second embodiment of this invention.

As shown in FIG. 6, the probe card 15 has a substrate. The substrate has a rectangular through hole 17 extending along a diameter 30 of the substrate 30. The substrate has a right half 33R and a left half 33L on the right and left sides of the diameter 30, respectively. Provided in the right half 33R are four wiring regions 35a to 35d. Provided in the left half 33L are four wiring regions 35e to 35h. In the wiring region 35a, a group 37a of wires is provided, connecting the probe contacts of a group 21a to the probe needles of the group 19a (not shown) which are to contact the pads of a chip 3a. Similarly, in the wiring region 35b, a group 37b of wires is provided, connecting the probe contacts of a group 21b to the probe needles of the group 19b (not shown) which are to contact the pads of a chip 3b. In the other wiring regions 35c to 35h, groups 37c to 37h of wires are provided, respectively, each connecting a probe pad to a probe needle. For example, the wires of the group 37h provided in the wiring region 35h connect the probe pads of the group 21h to the probe needles of the group 19h which are to contact the pads of a chip 3h.

Thus, the four groups 19a to 19d of probe needles to contact the chips 3a to 3d, groups 21a to 21d of probe contacts, and groups 37a to 37d of wires are arranged in the right half 33R of the substrate. The remaining four groups 19e to 19h of probe needles to contact the chips 3e to 3h, groups 21e to 21h of probe contacts, and groups 37e to 37h of wires are arranged in the [right] *left* half 33L of the substrate.

Arranged as shown in FIG. 6, the wires of the groups 37a to 37h are shorter than otherwise, and the difference in length between the longest and shortest wires provided is relatively small. Hence, the differences in resistance and capacitance among the wires is proportionally small. In addition, since the wires are short, the crosstalk among the wires is small. The probe card 15 according to the second embodiment can therefore help accomplish high-accuracy probing test, in which eight chips are tested at the same time.

Another probe card 15 according to the third embodiment of this invention will be described, with reference to FIG. 7 which is an exploded view. The third embodiment is similar to the first embodiment. It is characterized in that the substrate 20 is designed so as to reduce the crosstalk among the wires.

Figure 7:
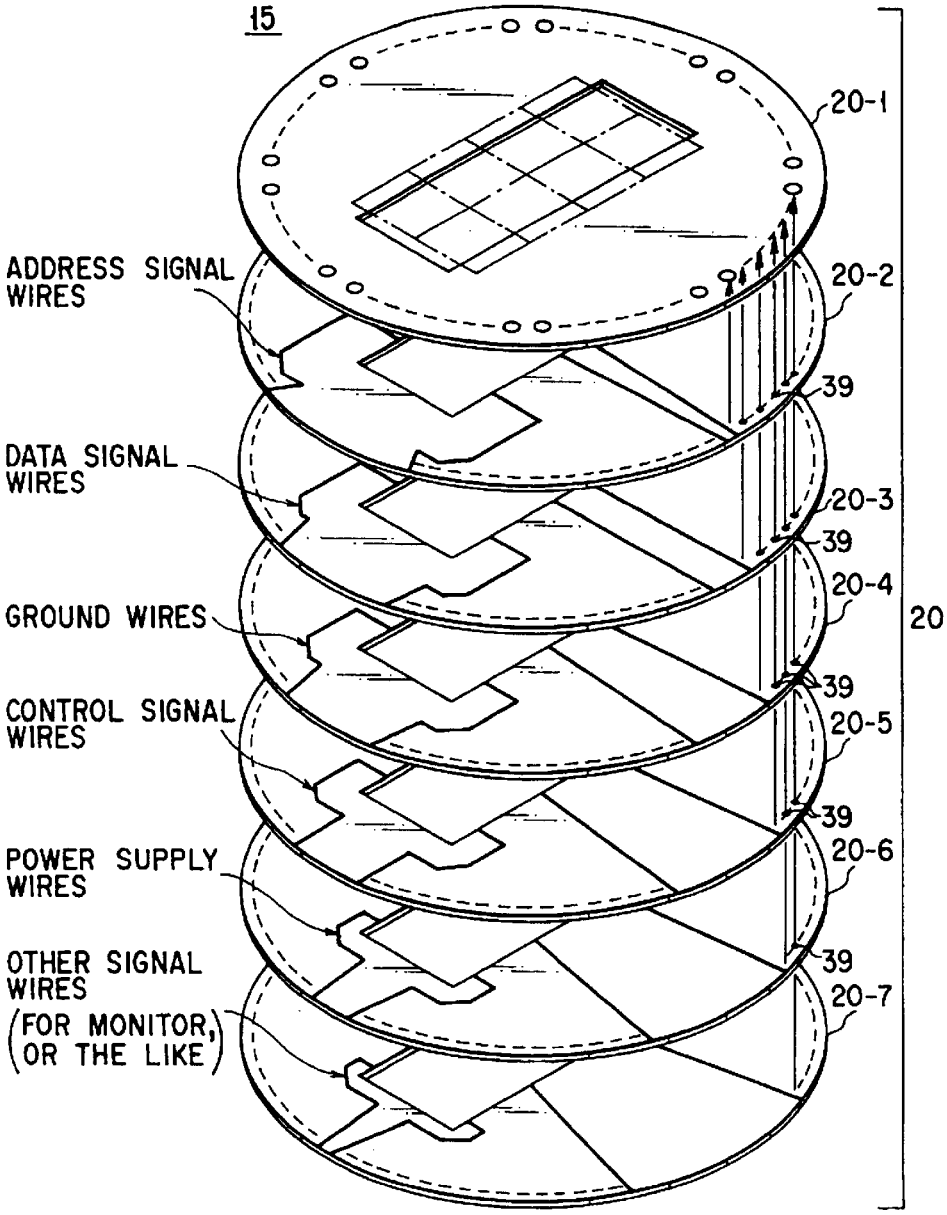
FIG. 7 is an exploded view of a probe card according to a third embodiment of the invention.

As illustrated in FIG. 7, the substrate 20 is composed of seven layers 20-1 to 20-7. Probe contacts 21 are mounted on the first layer 20-1. This probe card 15 is designed for use in testing semiconductor memories and has six types of wires 27, which are: address signal wires; data signal wires; ground (VSS) wires; control wires for supplying control signals such as row-address strobe signals and column-address strobe signals; power-supply wires; and other wires for a monitor or the like. The address signal wires are provided on the second layer 20-2, the data signal wires on the third layer 20-3, the ground wires on the fourth layer

20-4, the control wires on the fifth layer 20-5, the power-supply wires on the sixth layer 20-6, and the other wires on the seventh layer 20-7. The wires 37 provided on the second to seventh layers 20-2 to 20-7 extend through holes 39 made in these layers 20-2 to 20-7 and are connected to the probe contacts 21 which are provided on the first layer 20-1.

Since the wires 37 of each type are provided on one layer, not together with the wires of any other type, the crosstalk among the wires 37 is far less than in the case all wires are arranged densely on one and the same layer. The probe card 15 according to the third embodiment can, therefore, help to achieve high-accuracy probing test. It has eight groups of probe needles and can serve to test eight chips at the same time.

The third embodiment can be used in combination with the probe card according to the second embodiment.

Methods of probe-testing semiconductor integrated circuits by using the probe card according to the invention will be described as the fourth, fifth and sixth embodiments.

Figure 8:
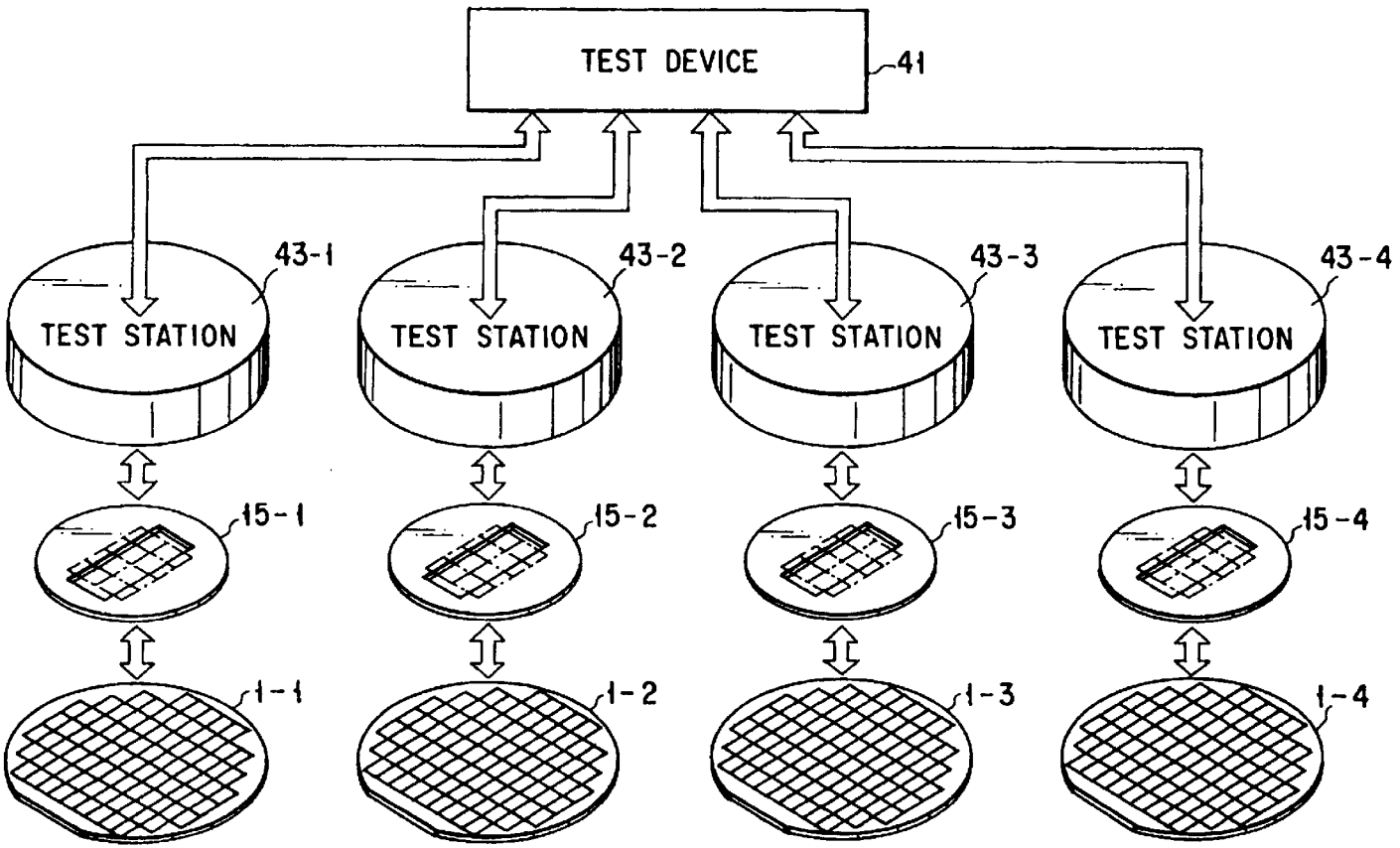
FIG. 8 is a diagram explaining a probe-testing method according to a fourth embodiment of the present invention.

FIG. 8 is a diagram explaining the probe-testing method according to the fourth embodiment. This method can test more chips at the same time than is possible by using the probe card 15 according to the first embodiment.

As shown in FIG. 8, four test stations 43-1 to 43-4 are provided for one tester 41. Each test station is equipped with one probe card. More precisely, the test stations 43-1 to 43-4 have probe cards 15-1 to 15-4, respectively. Four semiconductor wafers 1-1 to 1-4 are located at the test stations 43-1 to 43-4, respectively. Using the probe cards 15-1 to 15-4, the tester 41 tests four wafers 1-1 to 1-4 simultaneously.

With this method, the more test stations are installed, the more chips can be tested at the same time with high accuracy. Namely, L×M chips can be tested at a time, where L is the number of chips that can be simultaneously tested by using one probe card, and M is the number of test stations installed.

In the instance shown in FIG. 8, L=8 and M=4. Hence, the tester 41 can test 32 chips at a time. The probe cards 15-1 to 15-4 may be those of the first embodiment, the second embodiment, the third embodiment or a combination of the second and third embodiments. Since the probe card 15 of any embodiment serves to test chips with high accuracy, the tester 41 can test as many as 32 chips simultaneously with sufficiently high accuracy.

Figure 9:
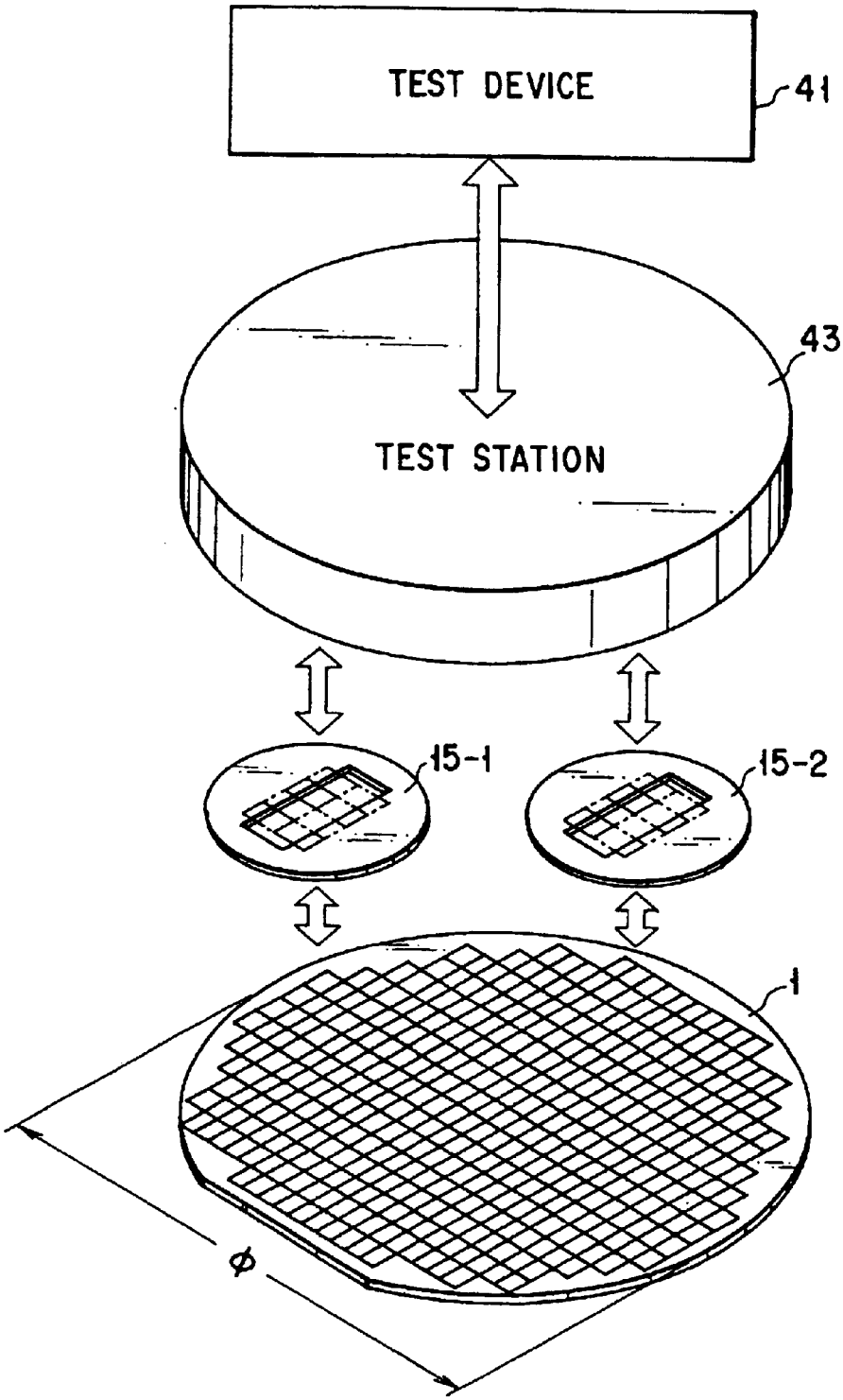
FIG. 9 is a diagram explaining a probe-testing method according to a fifth embodiment of this invention.

FIG. 9 is a diagram explaining the probe-testing method which is the fifth embodiment of this invention. The fifth embodiment requires but little cost per chip, and is better in cost performance than the method according to the fourth embodiment.

As illustrated in FIG. 9, the method uses one tester 41 and one test station 43. The test station 43 is equipped with two probe cards 15-1 and 15-2. The probe cards 15-1 and 15-2 are used at the same time to test chips provided on one semiconductor substrate 1. In this method, the tester 41 can test L×N chips simultaneously, where N is the number of probe cards provided at the test station 42 and L is the number of chips that can be simultaneously tested by using one probe card. Hence, one test station can test more chips at the same time than is possible with the fourth embodiment, with the same accuracy as is possible with the fourth embodiment. In the case shown in FIG. 9, wherein L=8 and N=2, the test station 42 can test 16 chips at a time, whereas each test station can test only 8 chips at a time in the fourth embodiment (FIG. 8). Furthermore, the accuracy of probing test remains high, because both probe cards 15-1 and 15-2 attached to the station 43.

Still further, the number of chips tested simultaneously at one test station increases since two or more probe cards 15 are attached to one test station. Therefore, the facility cost for testing one chip is low. Having only one test station, the [prober] *probing* system shown in FIG. 9 occupies a smaller floor area than the [prober] *probing* system shown in FIG. 8 which needs two test stations to test the same number of chips at the same time. The smaller the floor area required, the lower the air-conditioning cost required, or the [hither] *higher* the air purity in the probing room. In view of this, the probe-testing method according to the fifth embodiment helps to decrease the possibility that chips are contaminated with harmful substance such as sodium and the possibility that the wires of each chip are short-circuited by electrically conductive particles such as silicon dust.

As may be understood from FIG. 9, the method according to the fifth embodiment is advantageous when used to test a large semiconductor wafer which has an increased number of chips.

Figure 10:
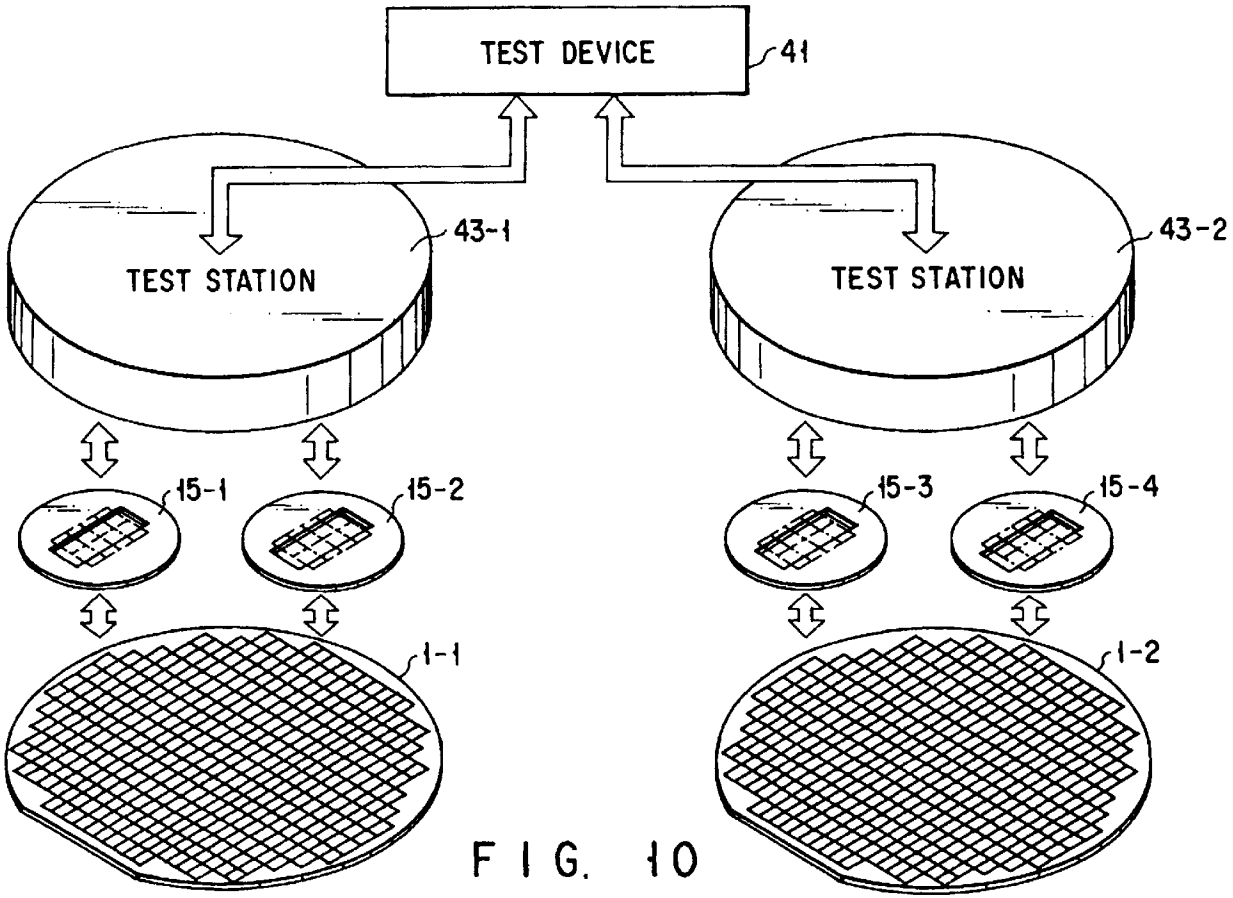
FIG. 10 is a diagram explaining a probe-testing method according to a sixth embodiment of the invention.

FIG. 10 is a diagram explaining a probe-testing method according to the sixth embodiment of the present invention. As may be seen from FIG. 10, the sixth embodiment is a combination of the methods according to the fourth and fifth embodiments.

In the sixth embodiment, two test stations 43-1 and 43-2 are provided for one tester 41, and two probe cards are attached to each test station. To be more specific, probe cards 15-1 and 15-2 are attached to the first test station 43-1, and probe cards 15-3 and 15-4 to the second test station 43-2. Two semiconductor wafers 1-1 and 1-2 are simultaneously tested at the test stations 43-1 and 43-2, respectively, by using the four probe cards 15-1 to 15-4.

The probe-testing method according to the sixth embodiment can test L×M×N chips at the same time, where L is the number of chips one probe card can test at a time, M is the number of test station provided, and N is the number of probe cards attached to one test station. The sixth embodiment can serve to test many chips simultaneously with high accuracy as does the fourth embodiment, and can achieve good cost performance as does the fifth embodiment.

A semiconductor IC [chips] *chip* which can be easily tested by using a probe card [which is] *according to* the seventh embodiment of the invention will *now* be described.

Like the first to third embodiments, this probe card is designed to test IC chips arranged in two columns and at least two rows, at the same time, to determine whether the chips are flawless or defective. The probe card comprises a substrate having a rectangular through hole. It is desirable that some of the probe needles be arranged along one long side of the hole to contact the pads of chips provided on a semiconductor wafer and forming one column and that the other probe needles be arranged along the other long side of the hole to contact the pads of chips provided on the wafer and forming a next column. If the probe needles are thus arranged, the wires provided on or in the substrate can be made shortest as has been explained in conjunction with the second embodiment.

A semiconductor IC chip should have pads arranged in a column to be tested [by] using [the] *a* probe card according to the invention, which has groups of probe needles arranged in the specific manner described above.

Figure 11:
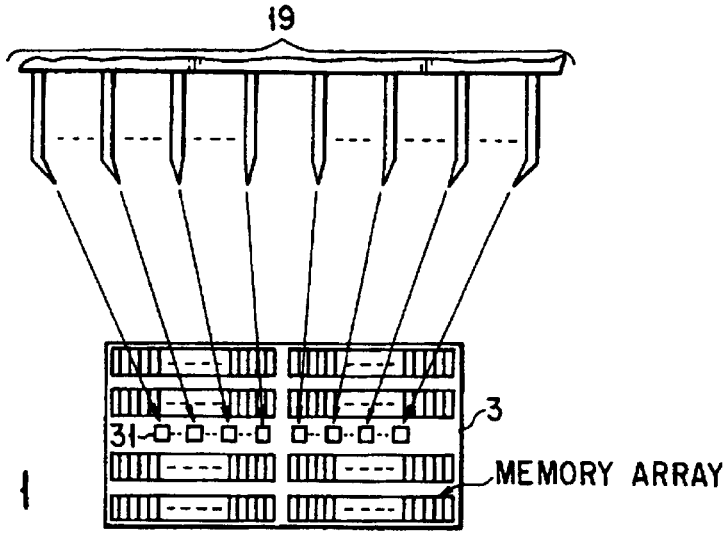
FIG. 11 is a diagram representing the positional relationship between the probe needles of a probe card according to a seventh embodiment of the invention, on the one hand, and the pads of an IC chip, on the other.

FIG. 11 is a diagram representing the positional relationship between the probe needles of the probe card, on the one hand, and the pads of the IC chip 3, on the other. As shown in FIG. 11, the chip 3 is rectangular and has a column of pads 31 arranged along the longitudinal axis. This type of a chip is known as "center-pad type" and is used in, for example, semiconductor memories of large storage capacity.

It is easy to bring the probe needles of one group 19 provided on the probe card into contact with the pads 31 because the pads 31 are arranged in a column. Even if identical chips on the semiconductor wafer are arranged in two columns as shown in FIG. 4, there will be formed only two columns of pads 31 which are to contact the probe needles of one group 19 provided on the probe card. Arranged in two columns, the pads 31 can easily contact the needles of the group 19 provided on the probe card, some of which are arranged along one long side of the rectangular hole of the substrate and the others of which are arranged along the other long side of the rectangular hole.

Figure 12:
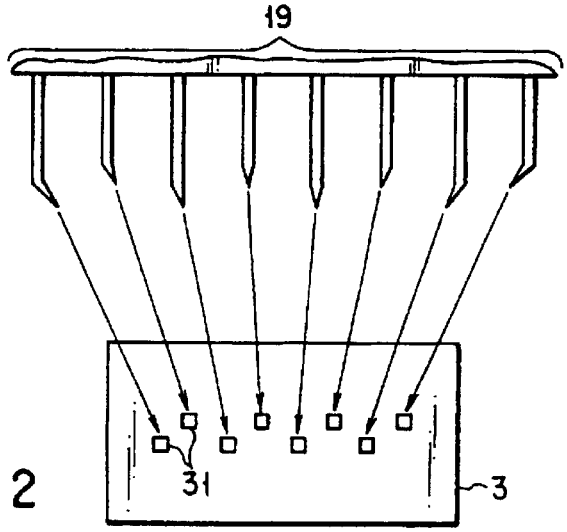
FIG. 12 is a diagram representing the positional relationship which the probe needles of the probe card according to a seventh embodiment may have with the pads of an IC chip.

Alternatively, the pads 31 may be arranged in staggered fashion as is illustrated in FIG. 12.

A probe card 15 according to the eighth embodiment of this invention will be described, with reference to FIG. 13 which is a perspective view.

Figure 13:
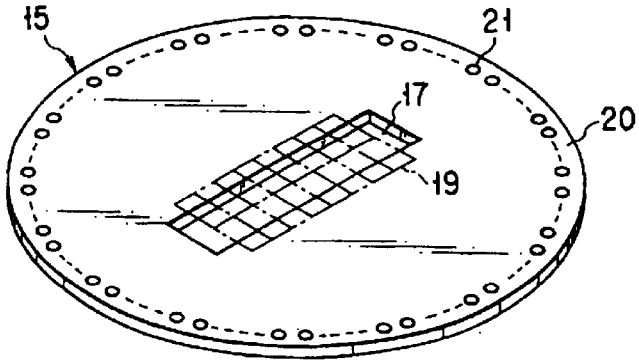
FIG. 13 is a perspective view of a probe card according to an eighth embodiment of the invention.

As shown in FIG. 13, this probe card 15 serves to test 16 chips simultaneously, which are arranged in eight rows and two columns, whereas the first embodiment (FIG. 3) serves to test eight chips at the same time, which are arranged in four rows and two columns.

Designed to test chips arranged in eight rows, the probe card 15 inevitably [have] *has* a larger diameter D than the first embodiment (FIG. 3). Hence, it may have the same problems as does the conventional probe card 5' (FIG. 2). Nevertheless, the eighth embodiment will be practically useful since the probe card technology is well expected to advance to simultaneously test 16 chips arranged in eight rows and two columns, with accuracy as high as in the case eight chips arranged in four rows and two columns are tested at the same time. Needless to say, the eighth embodiment has a smaller diameter than a conventional probe card which is designed to test 16 chips arranged in single column. The eighth embodiment (FIG. 13) can therefore help not only to increase the [productivity] *production* of semiconductor integrated circuits, but also to reduce the manufacturing cost of semiconductor integrated circuits.

As can be understood from the eighth embodiment, the present invention is not limited to probe cards which are designed to test eight chips arranged in four rows and two columns. Rather, the invention can provide probe cards which serve to test more chips at a time, arranged in more rows and two columns.

A probe card according to the ninth embodiment of the present invention will be described, with reference to FIGS. 14 and 15. The ninth embodiment is designed to test semiconductor memories each having a large storage capacity and, hence, a relatively large number of pads.

Figure 14:
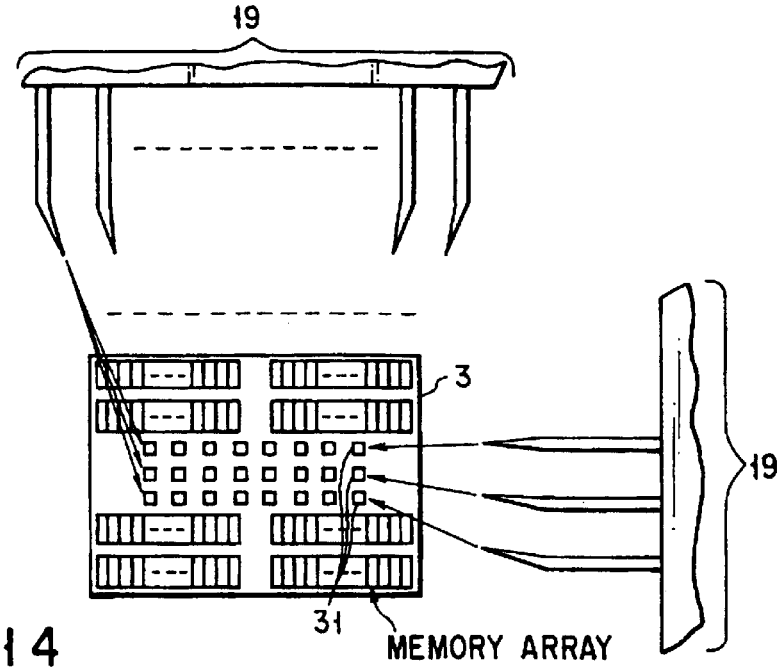
FIG. 14 is a diagram showing the positional relationship between the probe needles of a probe card according to a ninth embodiment, on the one hand, and the pads of an IC chip, on the other.
Figure 15:
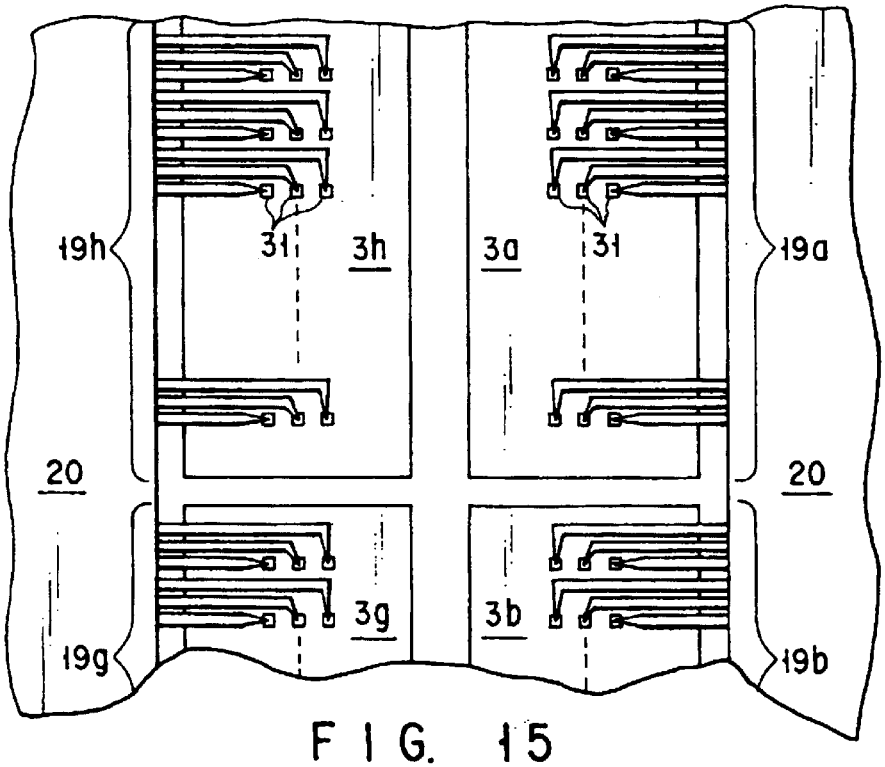
FIG. 15 is a magnified plan view of a part of the probe card shown in FIG. 14, showing the probe needles.

As shown in FIG. 14, a semiconductor memory to be tested has 24 pads arranged in eight rows and three columns. The probe card has group 19 of probe needles, each group consisting of 24 needles which are arranged in eight rows and three columns. FIG. 15 is a plan view showing how the probe needles of groups 19a to 19h are positioned with respect to the pads 31 of semiconductor memories 3a to 3h. (Shown in FIG. 15 are only groups 19a, 19b, 19g and 19h and only memories 3a, 3b, 3g and 3h.) As the probe card technology advances as expected, each group 19 may [consists] *consist* of more probe needles arranged in m rows and n column, where m>8 and n>3, whereby the probe card can test semiconductor integrated circuits each having more pads.

Figure 16:
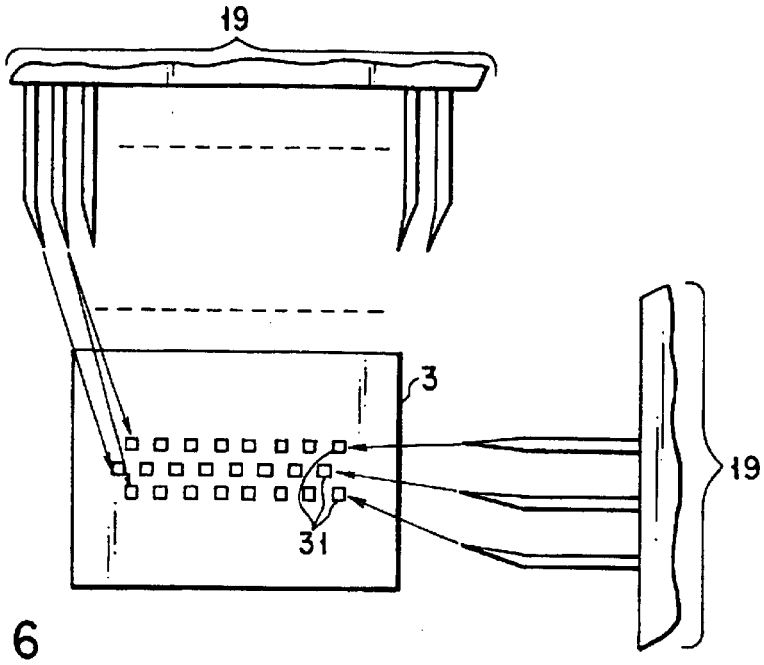
FIG. 16 is a diagram showing the positional relationship between the probe needles of a probe card according to a tenth embodiment, on the one hand, and the pads of an IC chip, on the other.
Figure 17:
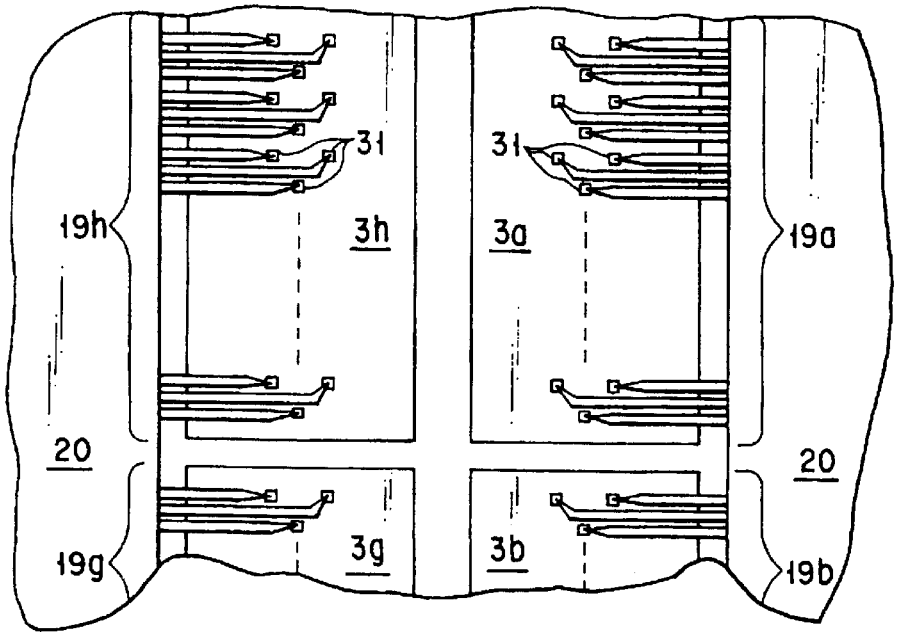
FIG. 17 is a magnified plan view of a part of the probe card shown in FIG. 16, illustrating the probe needles.

A probe card according to the tenth embodiment of the invention will be described, with reference to FIGS. 16 and 17. As seen from FIGS. 16 and 17, this probe card is designed to test semiconductor integrated circuits each having many pads 31 which are arranged in m rows and n columns in staggered fashion.

In the probe cards 15 according to the invention, which are shown in FIGS. 3, 6, 7 and 13, the probe contacts 21 are arranged in a circle, along the circumference of the substrate 20. The probe card may need to have so many probe contacts 21 that it is no longer possible to arrange the contacts 21 in one circle. If so, the probe contacts 21 may well be arranged in two or more concentric circles.

As has been described, the present invention can provide a probe card which can help to enhance the productivity of semiconductor integrated circuits and to reduce the manufacturing cost thereof, and can also provide a method of probe-testing semiconductor integrated circuits by using the probe card.

Additional advantages and modifications will readily occur to those skilled in the art. Therefore, the intention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A probed card for use in probing test of semiconductor integrated circuits arranged on a semiconductor wafer in rows and columns, comprising:

a card substrate;

groups of probe needles, said groups arranged on said card substrate in two columns and at least two rows, to contact connection terminals of semiconductor integrated circuits which are arranged in two columns and at least two rows, and groups of signal lines, each group of signal lines provided for one group of probe needles, each signal line provided for supplying a test signal from a tester to one probe needle and a response signal from the probe needle to the tester, wherein a test signal supplied from said tester is supplied from said probe needles to the semiconductor integrated circuits arranged in two columns and at least two rows at the same time through said groups of probe needles, and response signals generated by the semiconductor integrated circuits arranged in two columns and at least two rows are simultaneously supplied to the tester through said groups of probe needles.

2. The probe card according to claim 1, wherein said card substrate has a rectangular through hole having first and second long sides, the probe needles of the groups extend through the rectangular through hole, the probe needles of some groups are arranged along the first long side of the rectangular hole to contact the connection terminals of the semiconductor integrated circuits arranged in the first column, and the probe needles of the other groups are arranged along the second long side of the rectangular through hole to contact the connection terminals of the semiconductor integrated circuits arranged in the first column.

3. The probe card according to claim 1, wherein connection terminals of the semiconductor integrated circuits comprise a plurality of pads which are arranged in at least two columns.

4. The probe card according to claim 2, which further comprises groups of contacts exposed on a surface of said card substrate, to be connected to the tester, and groups of wires connecting the groups of probe contacts to the groups of probe needles; and in which said probe substrate consists of first and second halves divided along a longitudinal axis of said rectangular hole, the wires connected to the probe needles to contact the connection terminals of the semiconductor integrated circuits arranged in the first column and the probe contacts connected to these wires are provided on the first half of said probe substrate, and the wires connected to the probe needles to contact the connection terminals of the semiconductor integrated circuits arranged in the second column and the probe contacts connected to these wires are provided on the second half of said probe substrate.

5. The probe card according to claim 4, wherein said probe substrate comprises a plurality of layers, said wires are divided into groups in accordance with types of signals and types of powers, and the groups of wires, thus formed, are provided on the layers, respectively.

*6. A method for testing semiconductor integrated circuits, the method comprising:*

*providing a semiconductor wafer having a plurality of semiconductor integrated circuit chips arranged thereon in two columns and at least two rows, each of said plurality of semiconductor integrated chips having a plurality of external terminals;*

*coupling a probe card to the semiconductor wafer through a plurality of probe needles on said probe card corresponding to said plurality of external terminals of each of said integrated circuit chips, said probe card receiving a plurality of independent test signals and a power supply from a tester, wherein said probe card includes structure defining a rectangular through hole having first and second long sides, and wherein the probe needles extend through the rectangular through hole;*

*supplying the independent test signals and the power supply from the tester through the probe needles to said plurality of external terminals of said plurality of integrated circuits; and*

*measuring electric characteristics of said semiconductor integrated circuit chips in an independent manner.*

*7. The method of claim 6, wherein said external terminals are centrally disposed within said integrated circuit chips, with integrated circuits on either side of said external terminals.*

*8. The method of claim 7, wherein said external terminals are arranged in a plurality of columns and rows.*

*9. The method of claim 8, wherein the step of providing a semiconductor wafer includes forming memory arrays for each of said integrated circuit chips.*

*10. The method of claim 6, wherein the test signal and the power supply are supplied from said tester to said probe needles by way of a plurality of wiring lines on internal layers of said probe card.*

*11. The method of claim 6, wherein the test signal and the power supply are supplied from said tester to said probe needles by way of a plurality of wiring lines on different internal layers of said probe card, said wiring lines positioned on different ones of said different internal layers according to a type of signal carried by said wiring lines.*

*12. A probing test method of semiconductor integrated circuits, comprising:*

*preparing at least one semiconductor wafer, said semiconductor wafer having a plurality of semiconductor integrated circuit chips arranged thereon in rows and columns, said semiconductor integrated circuit chips having a plurality of external pads;*

*preparing at least one probe card, said probe card having a plurality of connection terminals for receiving from a tester a test signal and a power supply, said at least one probe card having a plurality of probe needles corresponding to said plurality of external pads, respectively, wherein said probe card includes structure defining a rectangular through hole having first and second long sides, and wherein the probe needles extend through the rectangular through hole;*

*supplying said test signal and said power supply from said tester to said probe needles by way of said connection terminals in a completely independent manner;*

*supplying said test signal and said power supply from said probe needles to said semiconductor integrated circuit chips, by way of said external pads, in a completely independent manner; and*

*measuring electric characteristics of the semiconductor integrated circuit chips in a completely independent manner.*

*13. The probing test method according to claim 12, wherein said test signal and said power supply are supplied from said connection terminals to said probe needles in a completely independent manner, by way of a plurality of completely independent wiring lines which are provided inside said probe card and to which said test signal and said power supply are transmitted.*

*14. The probing test method according to claim 12, wherein said test signal and said power supply are supplied from said connection terminals to said probe needles in a completely independent manner, by way of a plurality of wiring lines which are provided inside said probe card in accordance with kinds of signals and types of power supplies.*

*15. The probing test method according to claim 12, further comprising:*

*preparing at least one test station; and*

*attaching said probe card to said at least one test station.*

*16. The probing method according to claim 12, further comprising:*

*preparing at least one test station; and*

*attaching a plurality of probe cards to said at least one test station.*

* * * * *